(12) United States Patent
Gao et al.

(10) Patent No.: US 12,116,281 B2
(45) Date of Patent: Oct. 15, 2024

(54) METHOD FOR EFFICIENTLY ELIMINATING GRAPHENE WRINKLES FORMED BY CHEMICAL VAPOR DEPOSITION

(71) Applicant: NANJING UNIVERSITY, Jiangsu (CN)

(72) Inventors: Libo Gao, Jiangsu (CN); Guowen Yuan, Jiangsu (CN); Jie Xu, Jiangsu (CN)

(73) Assignee: NANJING UNIVERSITY, Jiangsu (CN)

( * ) Notice: Subject to any disclaimer, the term of this patent is extended or adjusted under 35 U.S.C. 154(b) by 632 days.

(21) Appl. No.: 17/416,525

(22) PCT Filed: Dec. 24, 2019

(86) PCT No.: PCT/CN2019/127803
§ 371 (c)(1),
(2) Date: Jun. 21, 2021

(87) PCT Pub. No.: WO2020/168819
PCT Pub. Date: Aug. 27, 2020

(65) Prior Publication Data
US 2022/0081300 A1 Mar. 17, 2022

(30) Foreign Application Priority Data

Feb. 20, 2019 (CN) .......................... 201910125659.2

(51) Int. Cl.
*C23C 16/50* (2006.01)
*C01B 32/186* (2017.01)
(Continued)

(52) U.S. Cl.
CPC .......... *C01B 32/186* (2017.08); *C01B 32/194* (2017.08); *C23C 16/26* (2013.01);
(Continued)

(58) Field of Classification Search
CPC .......... C23C 16/26; C23C 16/46; C23C 16/52
See application file for complete search history.

(56) References Cited

U.S. PATENT DOCUMENTS

| 2015/0079342 A1* | 3/2015 | Boyd | C01B 32/184 |
| | | | 428/141 |
| 2015/0136737 A1* | 5/2015 | Loh | C01B 32/186 |
| | | | 264/81 |

FOREIGN PATENT DOCUMENTS

| CN | 102260858 | 11/2011 |
| CN | 105110324 | 12/2015 |

(Continued)

OTHER PUBLICATIONS

"International Search Report (Form PCT/ISA/210) of PCT/CN2019/127803," mailed on Mar. 27, 2020, with English translation thereof, pp. 1-5.

*Primary Examiner* — Dah-Wei D. Yuan
*Assistant Examiner* — Kristen A Dagenais
(74) *Attorney, Agent, or Firm* — JCIP GLOBAL INC.

(57) ABSTRACT

A method for efficiently eliminating graphene wrinkles formed by chemical vapor deposition includes: directly growing super smooth wrinkle-free graphene films on metal substrates such as copper, nickel and alloys thereof and non-metal substrates such as silicon oxide and silicon carbide, or eliminating the wrinkles of wrinkled graphene through controlled proton injection at a high temperature by precisely controlling the temperature and hydrogen plasma power and time for generating protons; where the plasma-assisted chemical vapor deposition system includes a plasma generator, a vacuum system and a heating system; where the power of the plasma generator is 5 to 1000 W, the pressure of the vacuum system is $10^{-5}$ to $10^5$ Pa, and the heating temperature of the system is controllable between 25 to 1000° C.; directly growing a super smooth wrinkle-free (Continued)

graphene by injecting protons on various substrates during growth.

6 Claims, 3 Drawing Sheets

(51) Int. Cl.
*C01B 32/194* (2017.01)
*C23C 16/26* (2006.01)
*C23C 16/46* (2006.01)
*C23C 16/52* (2006.01)
*H01J 37/32* (2006.01)

(52) U.S. Cl.
CPC .............. *C23C 16/46* (2013.01); *C23C 16/50* (2013.01); *C23C 16/52* (2013.01); *H01J 37/321* (2013.01); *H01J 37/32816* (2013.01); *C01P 2002/82* (2013.01); *H01J 2237/3321* (2013.01)

(56) References Cited

FOREIGN PATENT DOCUMENTS

| | | | | |
|---|---|---|---|---|
| CN | 108502873 | | 9/2018 | |
| CN | 109824038 | | 5/2019 | |
| CN | 109824038 A | * | 5/2019 | ........... C01B 32/186 |
| GB | 2539016 | | 12/2017 | |
| JP | 2014024700 | | 2/2014 | |
| KR | 20160106869 | | 9/2016 | |

* cited by examiner

METHOD FOR EFFICIENTLY ELIMINATING GRAPHENE WRINKLES FORMED BY CHEMICAL VAPOR DEPOSITION

CROSS-REFERENCE TO RELATED APPLICATION

This application is a 371 of international application of PCT application serial no. PCT/CN2019/127803, filed on Dec. 24, 2019, which claims the priority benefit of China application no. 201910125659.2, filed on Feb. 20, 2019. The entirety of each of the above mentioned patent applications is hereby incorporated by reference herein and made a part of this specification.

BACKGROUND

Technical Field

The present application relates to the field of graphene growth, and in particular to a new method for efficiently eliminating graphene wrinkles formed by chemical vapor deposition.

In 2004, Andre Geim's Research Group at the University of Manchester obtained stable graphene by tape exfoliation (or micromechanical exfoliation) for the first time. Due to a unique two-dimensional crystal structure, graphene has excellent electrical, thermal and mechanical properties. It is believed that graphene will have broad applications in the fields of transparent conductive films, transistors, functional composites, energy storage and catalysis. Therefore, it is very important to find an appropriate method to prepare large-area high-quality graphene films for the industrialization of graphene applications.

At present, a variety of methods for preparing graphene have been developed successively, including mechanical exfoliation, chemical exfoliation, epitaxial growth and chemical vapor deposition (CVD). Based on a comprehensive comparison of existing preparation methods, CVD has attracted wide attention due to the simple preparation process, high quality and high yield. It is currently an important method for controllably preparing high-quality graphene and also an important means for realizing the industrialization of graphene. Currently, the graphene prepared by CVD is even more than 30 inches, which is a great progress for realizing industrial applications. The basic principle of CVD is catalytic dehydrogenation of a carbon source by reaction on a substrate at a high temperature, resulting in the growth of multilayer or single-layer graphene on the substrate.

Although high-quality graphene is prepared by CVD, there are always some shortcomings compared with the most intrinsic properties of graphene. The root cause is that graphene prepared by CVD is always defective due to grain boundaries and wrinkles during growth, and folds, breakage and tear introduced during transfer. Although researchers have eliminated the effects of grain boundaries by growing centimeter-scale single-crystal graphene, and have eliminated the effects of folds and breakage by optimizing the transfer process, there is no substantial improvement in the properties of the graphene prepared by CVD due to the prevalence of wrinkles.

Wrinkles arise from the high temperature growth environment for CVD. The temperature difference and difference in thermal expansion rate between graphene and the substrate lead to inevitable graphene wrinkles. Some vacancy defects are more likely to be introduced into wrinkled areas, which reduces the oxidation resistance of graphene, and leads to uneven mass distribution of graphene films. Therefore, improvement of existing CVD methods and exploration of means for controlling graphene wrinkles to fundamentally eliminate the wrinkles and prepare super smooth high-quality large-area graphene films are the key to real application of graphene to high-quality devices.

SUMMARY

The present application aims to provide a new method for efficiently eliminating graphene wrinkles and a graphene prepared by CVD. The method is mainly used for preparing a high-quality wrinkle-free graphene or reducing and completely eliminating graphene wrinkles. The present application reduces and eliminates wrinkles of graphene samples prepared by CVD through precise experimental control, so that intrinsic properties are retained. The size of the wrinkle-free graphene prepared by the present application is up to wafer level, which can be used as an ideal method for device assembly and basic researches. The present application provides a method for directly growing a super smooth wrinkle-free graphene by injecting protons on various substrates during the growth, and also includes a method for reducing and eliminating wrinkles by proton injection post-treatment of the wrinkled graphene grown in a conventional way.

The technical solution of the present application is as follows: a method for efficiently eliminating graphene wrinkles formed by chemical vapor deposition, includes: directly growing super smooth wrinkle-free graphene films on metal substrates such as copper, nickel and alloys thereof and non-metal substrates such as silicon oxide and silicon carbide, or eliminating wrinkles of wrinkled graphene through controlled proton injection at a high temperature by precisely controlling the temperature and hydrogen plasma power and time for generating protons; where the specific steps are as follows:

(1) placing a growth substrate in a plasma-assisted chemical vapor deposition system, adjusting an appropriate reaction atmosphere and pressure, simultaneously adjusting an appropriate coupled matching power, and keeping starting the plasma to react when the substrate is heated to a certain temperature; where the plasma-assisted chemical vapor deposition system includes a plasma generator, a vacuum system and a heating system; where the power of the plasma generator is adjustable from 5 to 1000 W, the pressure of the vacuum system is adjustable from $10^{-5}$ to $10^5$ Pa, and the temperature of the heating system is controllable between 25 to 1000° C.; and adjusting, by the plasma-assisted chemical vapor deposition technology, the reaction atmosphere and gas flow, reaction pressure, heating temperature, heating time, plasma power and reaction time; where the reaction gas can be methane, nitrogen, argon, helium, hydrogen, etc.; the gas flow is 50 to 2000 sccm; the reaction pressure is 1 to 20 Pa; the heating temperature is 500 to 1000° C., the heating time is 5 min to 2 h; the plasma power is 5 to 200 W, and the plasma reaction time is 60 to 3600 s; and (2) occurrence and end of a growth process: heating the substrate to a specified temperature, starting the plasma power and reaction time to allow a reaction to occur; after the reaction, cutting off the reaction gas, and cooling samples naturally to room temperature.

Steps of treating a wrinkled graphene to reduce and eliminate the wrinkles are as follows: (1) placing the wrinkled graphene (wrinkles are formed on graphene grown on metal substrates such as copper, nickel and platinum and non-metal substrates such as silicon oxide and silicon carbide by conventional chemical vapor deposition due to differences in thermal expansion rate) in a plasma-assisted chemical vapor deposition system, heating at a specific hydrogen pressure for a certain time, and adjusting an appropriate coupled matching power and reaction time for plasma reaction to reduce and eliminate graphene wrinkles; and adjusting, by the plasma-assisted chemical vapor deposition technology, the reaction temperature, pressure, reaction gas flow, heating time, plasma intensity and reaction time; where the reaction temperature is 100 to 1000° C., the reaction pressure is 1 to 100 Pa, the reaction gas can be hydrogen, the gas flow is 5 to 2000 sccm, the heating time is 60 to 3600 s, and the plasma reaction time is 60 to 1800 s.

The reaction substrates in the present application include metal substrates such as copper, nickel, platinum, iridium, ruthenium, tungsten, gold and silver, and non-metal substrates such as silicon oxide, aluminum oxide and silicon carbide.

The plasma-assisted chemical vapor deposition system in the present application includes a plasma generator, a vacuum system and a heating system, where the plasma generator is an inductively coupled RF plasma with the power adjustable from 5 to 1000 W, the pressure of the vacuum system is adjustable from $10^{-5}$ to $10^5$ Pa, and the temperature of the heating system is controllable between 25 to 1000° C.

The reaction substrates include metal substrates such as copper, nickel, platinum, iridium, ruthenium, tungsten, gold and silver, and non-metal substrates such as silicon oxide, aluminum oxide and silicon carbide.

The size of the samples is not limited and depends only on the design of a reaction system.

The plasma generator is an inductively coupled RF plasma with the power adjustable from 5 to 1000 W. The preferred power is 10 to 20 W for direct preparation of wrinkle-free graphene and 20 to 100 W for plasma post-treatment of wrinkled graphene. The plasma-assisted chemical vapor deposition system.

The reaction temperature, pressure, reaction gas flow, heating time, plasma intensity and reaction time are adjusted by the plasma-assisted chemical vapor deposition technology; where the reaction temperature is 500 to 1000° C., the pressure is 1 to 20 Pa, the reaction gas can be a carbon source gas and a carrier gas, including methane, nitrogen, argon, helium, hydrogen, etc., the gas flow is 50 to 1000 sccm, the heating time is 5 min to 1 h, the plasma power is 5 to 200 W, and the reaction time is 60 to 3600 s.

The wrinkled graphene is prepared by chemical vapor deposition, and a wrinkled graphene film is grown by adjusting the reaction temperature, pressure and carrier gas flow. The reaction temperature is 600 to 1400° C., the pressure is $10^{-2}$ to $10^5$ Pa, the carbon source gas can be methane, ethylene, acetylene and various gaseous carbon-containing organic substances (liquid or solid), the gas flow can be $10^{-5}$ to 100 sccm, the carrier gas can be hydrogen, nitrogen, helium, argon, etc., the gas flow is generally 5 to 5000 sccm, and the reaction time is 5 to 3600 s.

For the subsequent treatment of wrinkled samples, the heating time is 60 to 3600 s, and the heating temperature is 100 to 1000° C.; the plasma power is 10 to 500 W, the plasma reaction time is 1 to 30 min, and the reaction pressure is 1 to 100 Pa. The height of the wrinkles can be effectively reduced or eliminated, and can be less than or equal to 3 nm for single-layer graphene.

The samples in the present application can be of any size, depending only on the design of the reaction system.

The present application combines vacuum heating with a plasma-assisted system, on one hand, to effectively reduce and eliminate wrinkles based on the principle of selective proton permeation by adjusting the heating temperature and the hydrogen plasma power and time for wrinkled graphene grown on metal substrates such as copper, nickel, platinum, iridium, ruthenium, gold and silver and non-metal substrates such as silicon oxide, aluminum oxide and silicon carbide by CVD, thus achieving smoother graphene; and on the other hand, to produce wrinkle-free graphene directly by adding a hydrogen plasma during growth by CVD. Such control enables the preparation of smoother graphene and provides support for optimization of high-performance single crystal graphene and films in terms of preparation methods.

The present application can effectively reduce and eliminate wrinkles of graphene prepared by chemical vapor deposition through proton injection at a high temperature by precisely controlling the ambient temperature and pressure, and changing the hydrogen plasma power and action time for generating protons. The method is applicable to wrinkled graphene grown on metal substrates such as copper, platinum, nickel, iridium, ruthenium, tungsten, gold, silver and alloys thereof, and non-metal substrates such as silicon oxide, silicon carbide and silicon nitride. The present application takes advantage of the proton permeability of graphene and the impermeability of atomic hydrogen to produce protons at a certain concentration through a controlled hydrogen plasma, and the protons can be recombined into hydrogen atoms and molecules after permeating graphene, thus changing the interlayer coupling force between the graphene and the growth matrix to effectively control and eliminate graphene wrinkles. The wrinkle-free graphene deriving from direct growth or post-treatment, including single crystal graphene grains and films, can be of any size, and exhibits higher electrical properties. Such wrinkle-free graphene deriving from direct growth or post-treatment provides technical support for sample preparation of high-quality graphene in the fields of flexible electronic devices and micro-nano photoelectric devices in the future.

Beneficial Effects

1. In the present application, a wrinkle-free graphene is directly grown with the assistance of a plasma, so that the quality of the graphene is greatly improved, and the surface of the graphene is super smooth with few defects and high quality.

2. The present application can effectively adjust the height and distribution of graphene wrinkles by adjusting the heating temperature, heating time, plasma power and plasma reaction time.

3. The present application does not use any harmful substances in the process of reducing and eliminating the wrinkles, which is simple and efficient, and the wrinkle-free graphene can be produced in a very short time.

4. The present application is a universal method that can be applied to metal substrates such as copper, nickel, platinum, iridium, ruthenium, tungsten, gold and silver and alloys thereof, and non-metal substrates such as silicon oxide, aluminum oxide and silicon carbide.

In a word, the present application can effectively reduce and eliminate wrinkles of graphene prepared by chemical vapor deposition through heating at a high temperature and proton injection under hydrogen plasma by precisely controlling the heating temperature and plasma power, so that super smooth high-quality wrinkle-free graphene films can be directly grown on various substrates, and graphene wrinkles formed by conventional CVD can be reduced and eliminated by post-treatment. The super smooth wrinkle-free graphene films can be of any size, depending only on the design of the growth system. The controlled acquisition of such wrinkle-free graphene can improve the properties of the graphene grown by CVD, and provide technical support in preparation for the application in the fields of flexible electronic devices, high-performance electronics and photoelectric devices in the future.

The method of the present application is applicable to a wrinkled graphene grown on metal substrates such as copper, platinum, nickel, iridium, ruthenium, tungsten, gold, silver and alloys thereof, and non-metal substrates such as silicon oxide, silicon carbide and silicon nitride. The present application takes advantage of the proton permeability of graphene and the impermeability of atomic hydrogen to produce protons at a certain concentration through a controlled hydrogen plasma, and the protons can be recombined into hydrogen atoms and molecules after permeating graphene, thus changing the interlayer coupling force between the graphene and the growth matrix to effectively control and eliminate graphene wrinkles. The present application relates to a method for directly growing a super smooth wrinkle-free graphene by injecting protons on various substrates during growth, and also includes a method for reducing and eliminating wrinkles by proton injection post-treatment of wrinkled graphene grown in a conventional way. The wrinkle-free graphene deriving from direct growth or post-treatment, including single crystal graphene grains and films, can be of any size, and exhibits higher electrical properties. Such wrinkle-free graphene deriving from direct growth or post-treatment provides technical support for sample preparation of high-quality graphene in the fields of flexible electronic devices and micro-nano photoelectric devices in the future.

DESCRIPTION OF THE EMBODIMENTS

According to the method, super-smooth wrinkle-free graphene films are directly grown on metal substrates such as copper, nickel and alloys thereof or non-metal substrates such as silicon oxide and silicon carbide through heating at a high temperature and hydrogen plasma injection by precisely controlling the heating temperature and adjusting the plasma power. Specific examples are as follows.

Example 1

A wrinkle-free graphene is grown on a copper substrate with the assistance of a plasma, specifically: placing a smooth copper film (coated on sapphire) in a tubular furnace, heating to 1000° C., and holding for 40 min to obtain a relatively smooth copper surface; placing the copper substrate in a plasma-assisted chemical vapor deposition system, introducing hydrogen and methane at a ratio of 20:1 (with a total gas flow of 200 sccm), stabilizing the pressure in a reaction chamber to 10 Pa through a regulator valve, heating to 500 to 800° C., and holding for 1 to 10 min; starting an inductively coupled plasma generator, adjusting the power to 10 to 50 W, controlling the grain size and growth rate of the graphene film by changing the plasma power and time, and growing for 2 to 5 min generally to obtain a single-layer wrinkle-free graphene film; cooling naturally after the growth, and cutting off the gas when the temperature drops to near room temperature.

For the grown graphene sample, the surface homogeneity is observed by an optical microscope, the surface roughness is observed by an atomic force microscope, and the crystal mass of graphene is judged by Raman spectroscopy.

Example 2

Example 2 differs from Example 1 in that:
a wrinkle-free graphene is grown on a copper substrate with the assistance of a plasma, specifically: placing a smooth copper film (coated on sapphire) in a tubular furnace, heating to 1000° C., and holding for 40 min to obtain a relatively smooth copper surface; placing the copper substrate in a plasma-assisted chemical vapor deposition system, introducing hydrogen and methane at a ratio of 20:1 (in the example, the total gas flow can be 50 to 1000 sccm), stabilizing the pressure in a reaction chamber to 10 Pa through a regulator valve, heating to 500 to 800° C., and holding for 30 min (in the example, the holding time can be 5 min to 2 h); starting an inductively coupled plasma generator, adjusting the power to 10 to 50 W, controlling the grain size and growth rate of the graphene film by changing the plasma power and time, and growing for 2 to 5 min generally to obtain a single-layer wrinkle-free graphene film (in the example, the growth time can be adjusted between 60 and 3600 s to obtain wrinkle-free graphene grains and a single-layer wrinkle-free graphene film); cooling naturally after the growth, and cutting off the gas when the temperature drops to near room temperature.

For the grown graphene sample, the surface homogeneity is observed by an optical microscope, the surface roughness is observed by an atomic force microscope, and the crystal mass of graphene is judged by Raman spectroscopy.

Example 3

Example 3 differs from Example 1 in that:
a wrinkle-free graphene is grown on a nickel substrate with the assistance of a plasma, (in the example, the substrate is selected from metal substrates such as nickel, platinum, gold, silver, rhodium, iridium, ruthenium and alloy films, taking nickel for example), specifically: placing a smooth nickel film (coated on sapphire) in a tubular furnace, heating to 1000° C., and holding for 40 min to obtain a relatively smooth nickel surface; placing the nickel substrate in a plasma-assisted chemical vapor deposition system, introducing hydrogen and methane at a ratio of 40:1 (with a total gas flow of 200 sccm), stabilizing the pressure in a reaction chamber to 10 Pa through a regulator valve, heating to 500 to 800° C., and holding for 1 to 10 min; starting an inductively coupled plasma generator, adjusting the power to 10 to 50 W, controlling the grain size and growth rate of the graphene film by changing the plasma power and time, and growing for 2 to 5 min generally to obtain a single-layer wrinkle-free graphene film; cooling naturally after the growth, and cutting off the gas when the temperature drops to near room temperature.

For the prepared sample, the surface homogeneity and damage are observed by an optical microscope, the surface roughness is observed by an atomic force microscope, and the crystal mass of graphene is judged by Raman spectroscopy.

Example 4

Example 4 differs from Example 1 in that:
a wrinkle-free graphene is grown on an aluminum oxide substrate with the assistance of a plasma (in the example, the substrate is selected from non-metal substrates such as aluminum oxide, silicon oxide, silicon carbide, magnesium oxide, silicon and hexagonal boron nitride, taking aluminum oxide for example), specifically: placing the aluminum oxide substrate in a plasma-assisted chemical vapor deposition system, introducing hydrogen and methane at a ratio of 10:1 (with a total gas flow of 200 sccm), stabilizing the pressure in a reaction chamber to 10 Pa through a regulator valve, heating to 800 to 1000° C., and holding for 1 to 10 min; starting an inductively coupled plasma generator, adjusting the power to 50 to 200 W, controlling the grain size and growth rate of the graphene film by changing the plasma power and time, and growing for 5 to 10 min generally to obtain a single-layer wrinkle-free graphene film; cooling naturally after the growth, and cutting off the gas when the temperature drops to near room temperature.

For the prepared sample, the surface homogeneity and damage are observed by an optical microscope, the surface roughness is observed by an atomic force microscope, and the crystal mass of graphene is judged by Raman spectroscopy.

Example 5

Example 5 differs from Example 4 in that:
a wrinkle-free graphene is grown on an aluminum oxide substrate with the assistance of a plasma (in the example, the substrate is selected from non-metal substrates such as aluminum oxide, silicon oxide, silicon carbide, magnesium oxide, silicon and hexagonal boron nitride, taking aluminum oxide for example), specifically: placing the aluminum oxide substrate in a plasma-assisted chemical vapor deposition system, introducing hydrogen and methane at a ratio of 10:1 (in the example, the total gas flow can be adjusted to 50 to 1000 sccm), stabilizing the pressure in a reaction chamber to 10 Pa through a regulator valve (in the example, the pressure is stabilized at 1 to 20 Pa), heating to 800 to 1000° C., and holding for 30 min (in the example, the holding time is adjusted to 5 min to 2 h); starting an inductively coupled plasma generator, adjusting the power to 50 to 200 W, controlling the grain size and growth rate of the graphene film by changing the plasma power and time, and growing for 5 to 10 min generally to obtain a single-layer wrinkle-free graphene film; cooling naturally after the growth, and cutting off the gas when the temperature drops to near room temperature.

For the prepared sample, the surface homogeneity and damage are observed by an optical microscope, the surface roughness is observed by an atomic force microscope, and the crystal mass of graphene is judged by Raman spectroscopy.

Example 6 (Supplementary Examples 6 and 7 for Preparation of Wrinkled Graphene)

Example 6 differs from Example 1 in that:
wrinkles of graphene grown on a copper substrate is reduced and eliminated by heating at a high temperature with the assistance of a plasma, specifically: growing a wrinkled graphene film on the copper substrate (in the example, the wrinkled graphene is grown at a normal pressure with methane as a carbon source): placing the copper substrate in a tubular furnace, introducing argon and hydrogen at a ratio of 10:1, with a total gas flow of 500 sccm, then heating to 1000° C. and holding for 40 min for annealing, then introducing 5 to 50 sccm of 1% diluted methane, growing at a normal pressure for 600 to 3600 s, and cooling naturally to obtain wrinkled graphene; then placing the wrinkled graphene in a plasma-assisted chemical vapor deposition system, introducing hydrogen, stabilizing the pressure in a reaction chamber to 10 Pa through a regulator valve, heating to 500 to 800° C., and holding for 1 to 10 min; starting an inductively coupled plasma generator, adjusting the power to 10 to 50 W, and treating for 1 to 5 min generally to effectively reduce and eliminate wrinkles of the graphene film; cooling naturally after the treatment, and cutting off the gas when the temperature drops to near room temperature.

For the treated sample, the surface homogeneity and damage are observed by an optical microscope, information such as the surface roughness, wrinkles and the like are observed by an atomic force microscope, and the crystal mass of graphene is judged by Raman spectroscopy.

Example 7

Example 7 differs from Example 6 in that:
wrinkles of graphene grown on a copper substrate is reduced and eliminated by heating at a high temperature with the assistance of a plasma, specifically: growing a wrinkled graphene film on the copper substrate (in the example, the carbon source is selected from ethylene, acetylene, various gaseous carbon organic substances (liquid or solid), the reaction pressure is $10^{-2}$ to $10^5$ Pa, and the carrier gas is hydrogen, helium, argon, etc.): taking ethylene for example, obtaining a wrinkled graphene film on the copper substrate with a reaction pressure of $10^{-1}$ Pa, a total gas flow of 10 sccm, a reaction temperature of 800° C. and a growth time of 600 s; then placing the wrinkled graphene in a plasma-assisted chemical vapor deposition system, introducing hydrogen, stabilizing the pressure in a reaction chamber to 10 Pa through a regulator valve, heating to 500 to 800° C., and holding for 1 to 10 min; starting an inductively coupled plasma generator, adjusting the power to 10 to 50 W, and treating for 1 to 5 min generally to effectively reduce and eliminate wrinkles of the graphene film; cooling naturally after the treatment, and cutting off the gas when the temperature drops to near room temperature.

For the treated sample, the surface homogeneity and damage are observed by an optical microscope, information such as the surface roughness, wrinkles and the like are observed by an atomic force microscope, and the crystal mass of graphene is judged by Raman spectroscopy.

Example 8

Example 8 differs from Example 6 in that:
wrinkles of graphene grown on a nickel substrate is reduced and eliminated by heating at a high temperature with the assistance of a plasma, (in the example, the substrate is selected from metal substrates such as nickel, platinum, gold, silver, rhodium, iridium, ruthenium and alloy films, taking nickel for example), specifically: placing a wrinkled graphene film grown on the nickel substrate in a plasma-assisted chemical vapor deposition system, introducing hydrogen, stabilizing the pressure in a reaction chamber to 10 Pa through a regulator valve, heating to 500 to 800° C., and holding for 1 to 10 min; starting an inductively coupled plasma generator, adjusting the power to 10 to 50 W, and treating for 1 to 5 min generally to effectively reduce and eliminate wrinkles of the graphene film; cooling naturally after the treatment, and cutting off the gas when the temperature drops to near room temperature.

For the treated sample, the surface homogeneity and damage are observed by an optical microscope, information such as the surface roughness, wrinkles and the like are observed by an atomic force microscope, and the crystal mass of graphene is judged by Raman spectroscopy.

Example 9

For the subsequent treatment of wrinkled samples, the heating time is 60 to 3600 s, and the heating temperature is 100 to 1000° C.; the plasma power is 10 to 500 W, the plasma reaction time is 1 to 30 min, and the reaction pressure is 1 to 100 Pa. Example 9 differs from Example 6 in that: wrinkles of graphene grown on an aluminum oxide substrate is reduced and eliminated by heating at a high temperature with the assistance of a plasma, (in the example, the substrate is selected from non-metal substrates such as aluminum oxide, silicon oxide, silicon carbide, magnesium oxide, silicon and hexagonal boron nitride, taking aluminum oxide for example), specifically: placing a wrinkled graphene film grown on the aluminum oxide substrate in a plasma-assisted chemical vapor deposition system, introducing hydrogen, stabilizing the pressure in a reaction chamber to 10 Pa through a regulator valve, heating to 800 to 1000° C., and holding for 1 to 10 min; starting an inductively coupled plasma generator, adjusting the power to 50 to 200 W, and treating for 5 to 10 min generally to effectively reduce and eliminate wrinkles of the graphene film; cooling naturally after the treatment, and cutting off the gas when the temperature drops to near room temperature.

For the treated sample, the surface homogeneity and damage are observed by an optical microscope, information such as the surface roughness, wrinkles and the like are observed by an atomic force microscope, and the crystal mass of graphene is judged by Raman spectroscopy.

Example 10

Example 10 differs from Example 9 in that:
wrinkles of graphene grown on an aluminum oxide substrate is reduced and eliminated by heating at a high temperature with the assistance of a plasma, (in the example, the substrate is selected from non-metal substrates such as aluminum oxide, silicon oxide, silicon carbide, magnesium oxide, silicon and hexagonal boron nitride, taking aluminum oxide for example), specifically: placing a wrinkled graphene film grown on the aluminum oxide substrate in a plasma-assisted chemical vapor deposition system, introducing hydrogen, stabilizing the pressure in a reaction chamber to 10 Pa through a regulator valve, heating to 300° C. (in the example, the heating temperature is reduced to 100 to 500° C.), and holding for 1 to 10 min; starting an inductively coupled plasma generator, adjusting the power to 300 W (in the example, the reaction power is increased to 200 to 500 W), and treating for 20 min (in the example, the treatment time is prolonged) to effectively reduce and eliminate wrinkles of the graphene film; cooling naturally after the treatment, and cutting off the gas when the temperature drops to near room temperature.

For the treated sample, the surface homogeneity and damage are observed by an optical microscope, information such as the surface roughness, wrinkles and the like are observed by an atomic force microscope, and the crystal mass of graphene is judged by Raman spectroscopy.

Figure 1:
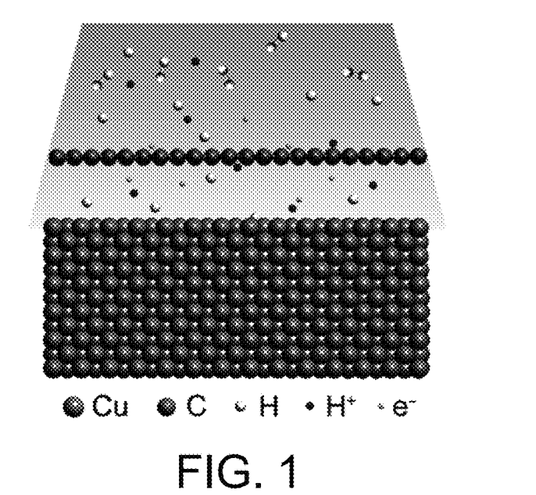
FIG. 1 is a schematic diagram of reducing and eliminating graphene wrinkles on a copper substrate.

FIG. 1 illustrates a schematic diagram of reducing and eliminating graphene wrinkles on a copper substrate.

Figure 2:
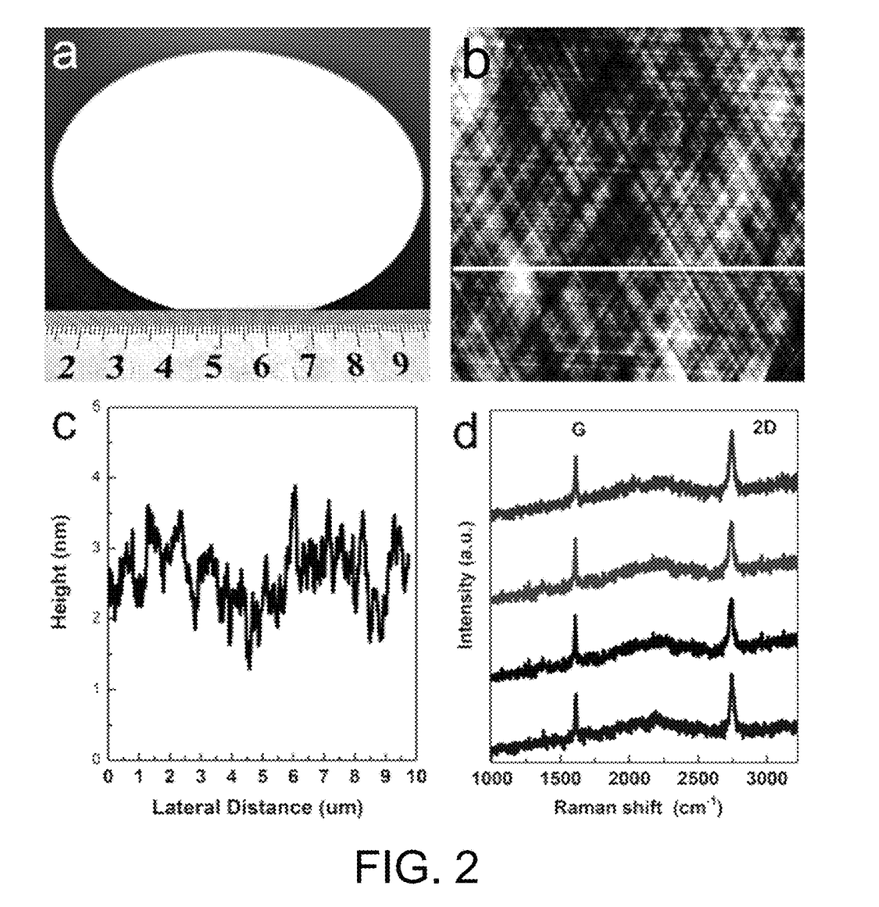
FIG. 2 shows a wrinkle-free graphene grown on a copper substrate: (a) a picture of a 20 cm wrinkle-free graphene film; (b) a corresponding atomic force microscope image; (c) a height map from (b) at the position marked with a solid black line; (d) a micro-Raman spectrum of a wrinkle-free graphene.

FIG. 2 illustrates a wrinkle-free graphene grown directly on a copper substrate: (a) a picture of a 10 cm wrinkle-free graphene film; (b) a corresponding atomic force microscope image; (c) a height map from (b) at the position marked with a solid black line; (d) a micro-Raman spectrum of a wrinkle-free graphene.

Figure 3:
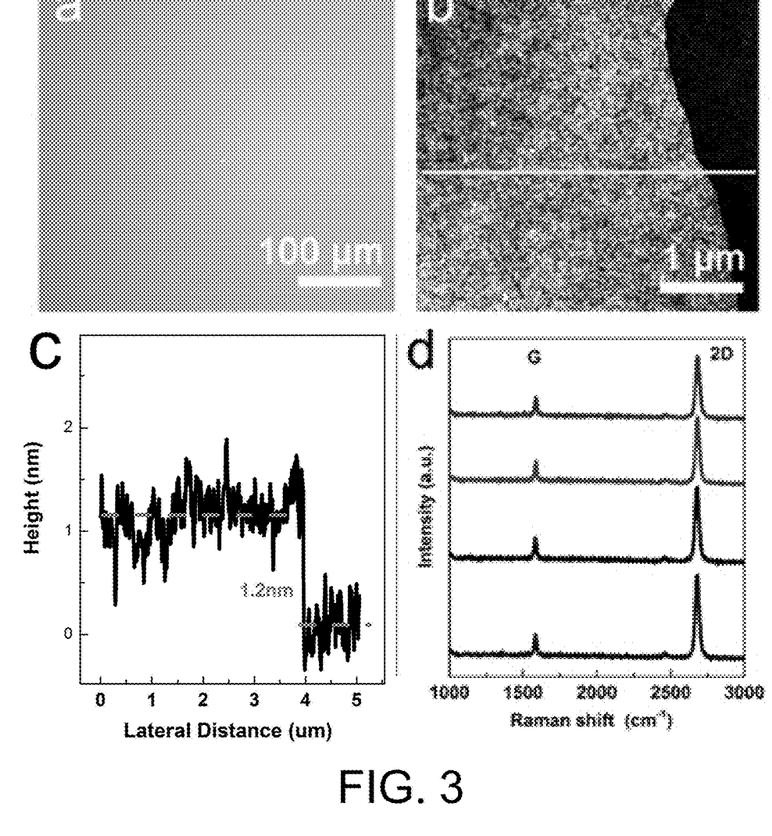
FIG. 3 shows a wrinkle-free graphene film transferred to the surface of a silicon wafer with an oxide layer: (a) an optical photograph; (b) an atomic force microscope image; (c) a height map from (b) at the position marked with a solid black line.

FIG. 3 illustrates a wrinkle-free graphene film transferred to the surface of a silicon wafer with an oxide layer: (a) an optical photograph; (b) an atomic force microscope image; (c) a height map from (b) at the position marked with a solid black line; (d) a micro-Raman spectrum of a wrinkle-free graphene.

Figure 4:
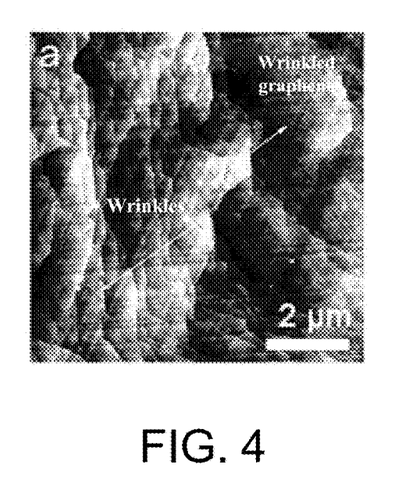
FIG. 4 is an atomic force microscope image of a wrinkled graphene before treatment.
Figure 5:
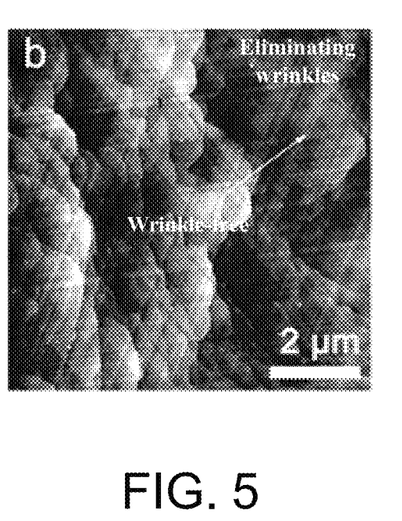
FIG. 5 is an atomic force microscope image (wrinkle-free) measured at the same position as in FIG. 4 of a wrinkled graphene subject to the post-treatment.

Comparison of atomic force microscope images measured at the same position by post-treatment of the wrinkled graphene as shown in FIG. 4 and FIG. 5.

What is claimed is:
1. A method for eliminating graphene wrinkles formed by chemical vapor deposition, comprising steps of treating a wrinkled graphene to reduce and eliminate the wrinkles:
step 1: placing the wrinkled graphene formed on metal substrates or non-metal substrates by a conventional chemical vapor deposition in a plasma-assisted chemical vapor deposition system, heating at a specific hydrogen pressure for a certain time, and adjusting an appropriate coupled matching power and reaction time for plasma reaction to reduce and eliminate the graphene wrinkles; and adjusting, by the plasma-assisted chemical vapor deposition technology, the reaction temperature, pressure, reaction gas flow, heating time, plasma intensity and reaction time; wherein the reaction temperature is 100 to 1000° C., the reaction pressure is 1 to 100 Pa, the reaction gas includes hydrogen, the gas flow is 5 to 2000 sccm, the heating time is 60 to 3600 s, and the plasma reaction time is 60 to 1800 s.

2. The method according to claim 1, wherein the wrinkled graphene is prepared by chemical vapor deposition, and a wrinkled graphene film is grown by adjusting the reaction temperature, pressure and carrier gas flow; wherein the reaction temperature is 600 to 1400° C., the pressure is $10^{-2}$ to $10^5$ Pa, a carbon source gas includes methane, ethylene, acetylene and various carbon-containing organic substances which are gaseous, liquid or solid, the gas flow is $10^{-5}$ to 100 sccm, a carrier gas is hydrogen, nitrogen, helium, or argon, the gas flow is generally 5 to 5000 sccm, and the reaction time is 5 to 3600 s.

3. The method according to claim 1, wherein for the subsequent treatment of the wrinkled graphene, the heating time is 60 to 3600 s, and the heating temperature is 100 to 1000° C.; the plasma power is 10 to 500 W, the plasma reaction time is 1 to 30 min, and the reaction pressure is 1 to 100 Pa.

4. The method according to claim 1, wherein the metal substrates comprises copper, nickel, platinum, iridium, ruthenium, tungsten, gold or silver, and the non-metal substrates comprises silicon oxide, aluminum oxide or silicon carbide.

5. The method according to claim 1, wherein a plasma generator used in the plasma-assisted chemical vapor deposition technology is an inductively coupled RF plasma with the power adjustable from 5 to 1000 W, the pressure of the vacuum system is adjustable from $10^{-5}$ to $10^5$ Pa, and the temperature of the heating system is controllable between 25 to 1000° C.

6. The method according to claim 1, wherein the height of the wrinkles is reduced or eliminated, and is less than or equal to 3 nm for single-layer graphene.

* * * * *